(12) United States Patent
Kawaguchi et al.

(10) Patent No.: US 12,708,023 B2
(45) Date of Patent: Aug. 11, 2026

(54) METHOD OF MANUFACTURING SEMICONDUCTOR ELEMENT

(71) Applicant: NICHIA CORPORATION, Anan (JP)

(72) Inventors: Hirofumi Kawaguchi, Tokushima (JP); Takehiro Ishitani, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 357 days.

(21) Appl. No.: 18/536,945

(22) Filed: Dec. 12, 2023

(65) Prior Publication Data

US 2024/0213038 A1 Jun. 27, 2024

(30) Foreign Application Priority Data

Dec. 26, 2022 (JP) ................................ 2022-208694

(51) Int. Cl.
*H10W 74/01* (2026.01)
*H10P 50/00* (2026.01)
*H10P 50/28* (2026.01)

(52) U.S. Cl.
CPC ......... *H10W 74/014* (2026.01); *H10P 50/283* (2026.01); *H10P 50/287* (2026.01); *H10P 50/73* (2026.01)

(58) Field of Classification Search
CPC .. H10W 74/014; H10P 50/283; H10P 50/287; H10P 50/73; H10H 20/00–882; H10H 29/30–962; H10H 29/00–142; H10H 29/882; H10H 29/842–8421; H10H 29/851–8516
See application file for complete search history.

(56) References Cited

U.S. PATENT DOCUMENTS 7,244,628 B2 * 7/2007 Tamura ................ H10H 20/018 438/33
2014/0361321 A1 12/2014 Saito et al.
2015/0041836 A1 2/2015 Saito et al.
2015/0364643 A1 12/2015 Sumitomo et al.
2020/0266176 A1 8/2020 Ichikawa et al.
2022/0069159 A1 3/2022 Takagi

FOREIGN PATENT DOCUMENTS

JP 2006-147870 A 6/2006
JP 2009-049188 A 3/2009
JP 2014-183109 A 9/2014
JP 2014-239171 A 12/2014
JP 2015-032809 A 2/2015
JP 2016-015467 A 1/2016
JP 2020-134921 A 8/2020
JP 2022-041533 A 3/2022

* cited by examiner

*Primary Examiner* — Cuong B Nguyen
(74) *Attorney, Agent, or Firm* — Foley & Lardner LLP

(57) ABSTRACT

A method of manufacturing a semiconductor element includes: providing a structure including: a semiconductor structure, a resin member, and a first insulation film; forming a cover member disposed continuously on a portion of the first insulation film; forming a resist film on the cover member, and removing a portion of the cover member; removing a portion of the first insulation film and a portion of the resin member; and removing a remaining portion of the cover member.

12 Claims, 20 Drawing Sheets

METHOD OF MANUFACTURING SEMICONDUCTOR ELEMENT

CROSS REFERENCE TO RELATED APPLICATION

This application claims priority to Japanese Patent Applications No. 2022-208694, filed on Dec. 26, 2022, the entire contents of which are hereby incorporated by reference.

BACKGROUND

The present disclosure relates to a method of manufacturing a semiconductor element.

For example, Japanese Patent Publication No. 2015-32809 discloses a process of etching inorganic film and resin by using a resist as a mask.

SUMMARY

One object of certain embodiments of the present invention is to provide a method of manufacturing a semiconductor element of high reliability.

According to one embodiment of the present invention, a method of manufacturing a semiconductor element includes: providing a structure including a semiconductor structure having a first surface, a second surface positioned opposite the first surface, and a third surface connecting the first surface and the second surface, a resin member disposed on a second surface side and covering the second surface and the third surface, and a first insulation film continuous on the first surface and a surface of the resin member adjacent to the first surface in a plan view; forming a cover member to be continuous on a portion of the first insulation film located on the first surface and a portion of the first insulation film located on the surface of the resin member; forming a resist film on the cover member and removing a portion of the cover member located on the surface of the resin member to allow the cover member to remain on the portion of the first insulation film located on the first surface; subsequent to the step of allowing the cover member to remain, removing a portion of the first insulation film and a portion of the resin member that are located in a region not overlapping the cover member in a plan view by etching using the cover member as a mask; and subsequent to the step of removing the portion of the first insulation film and the portion of the resin member, removing the cover member. The etch rate for the cover member in the step of removing the portion of the first insulation film and the portion of the resin member is lower than the etch rate for the resist film in the step of removing the portion of the first insulation film and the portion of the resin member.

According to certain embodiments of the present invention, a method of manufacturing a semiconductor element of high reliability can be provided.

DETAILED DESCRIPTION

Figure 1:
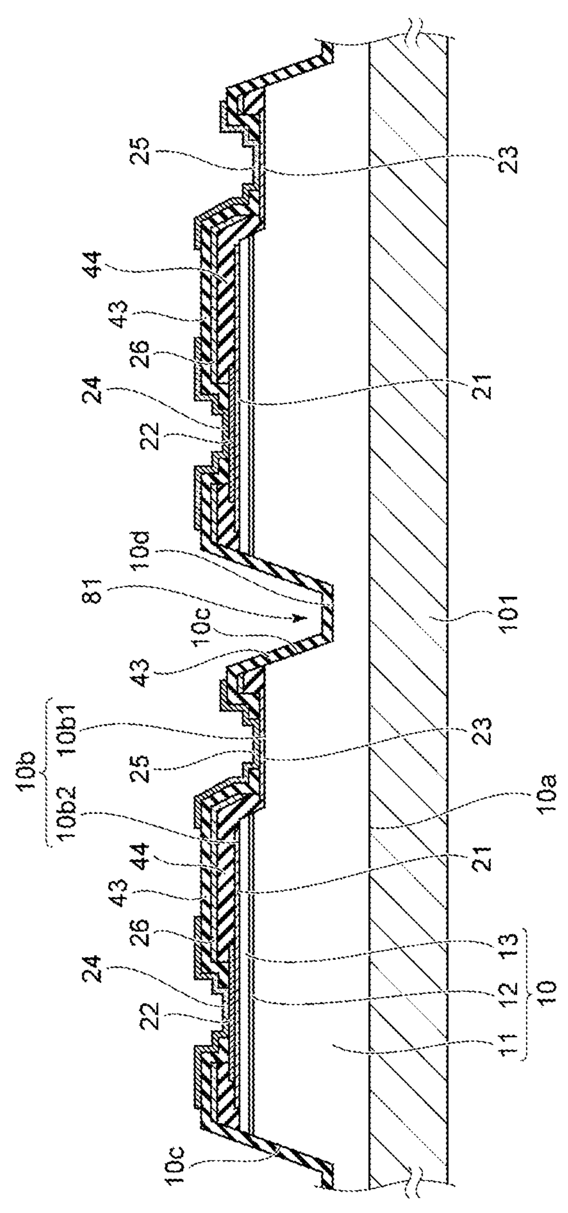
FIG. 1 is a schematic cross-sectional view explaining a step in a method of manufacturing a semiconductor element according to an embodiment of the present invention.

Certain embodiments will be explained below with reference to the accompanying drawings. The dimensions, materials, shapes, and relative positions of the constituents described in the embodiments are not intended to limit the members to those described unless specifically stated otherwise, and thus are provided merely as examples for explanation purposes. The sizes and positional relationships of the members in each drawing might be exaggerated for clarity of explanation. In the description below, the same designations and reference numerals denote the same or similar members for which detailed explanation will be omitted as appropriate. Furthermore, an end surface view which only shows a cut section might be used as a cross-sectional view. In a cross-sectional view, no hatching is applied to the cross section of a semiconductor structure in order to make the semiconductor structure easier to see.

In the description below, terms indicating specific directions or positions (e.g., "upper," "lower," and other terms including or related to these) might be used. These terms, however, are merely used in order to make the relative directions or positions in the drawings being referenced more easily understood. As long as the relationship between relative directions or positions indicated with the terms such as "upper," "lower," or the like is the same as those in a referenced drawing, the layout of the elements in other drawings or actual products does not have to be the same as those shown in the referenced drawing. In the present specification, the positional relationship expressed by "upper (or lower)" includes, assuming that there are two members, for example, the case in which the two members are in contact and the case in which one member is positioned above (or under) the other member without contacting one another. In the present specification, moreover, unless otherwise specifically stated, a member covering another member includes the case in which the member directly covers the other member and is in contact therewith and the case in which the member indirectly covers the other member and is not in contact therewith.

In the embodiment described below, a method of manufacturing a light emitting element as one example of semiconductor elements will be explained. A semiconductor element is not limited to a light emitting element, and may be a light receiving element, diode, transistor, or the like.

Step of Providing Structure

Figure 9:
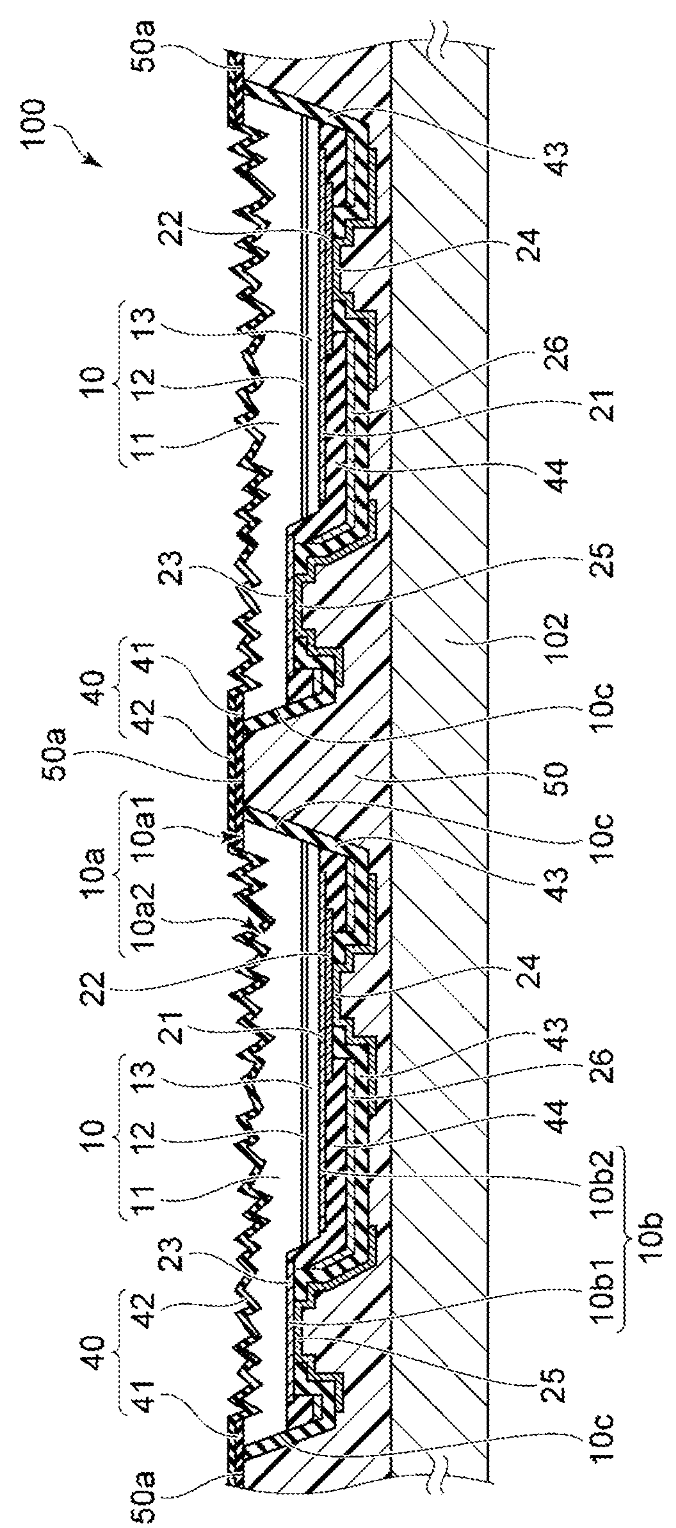
FIG. 9 is a schematic cross-sectional view explaining a step in the method of manufacturing a semiconductor element according to the embodiment of the present invention.
Figure 10:
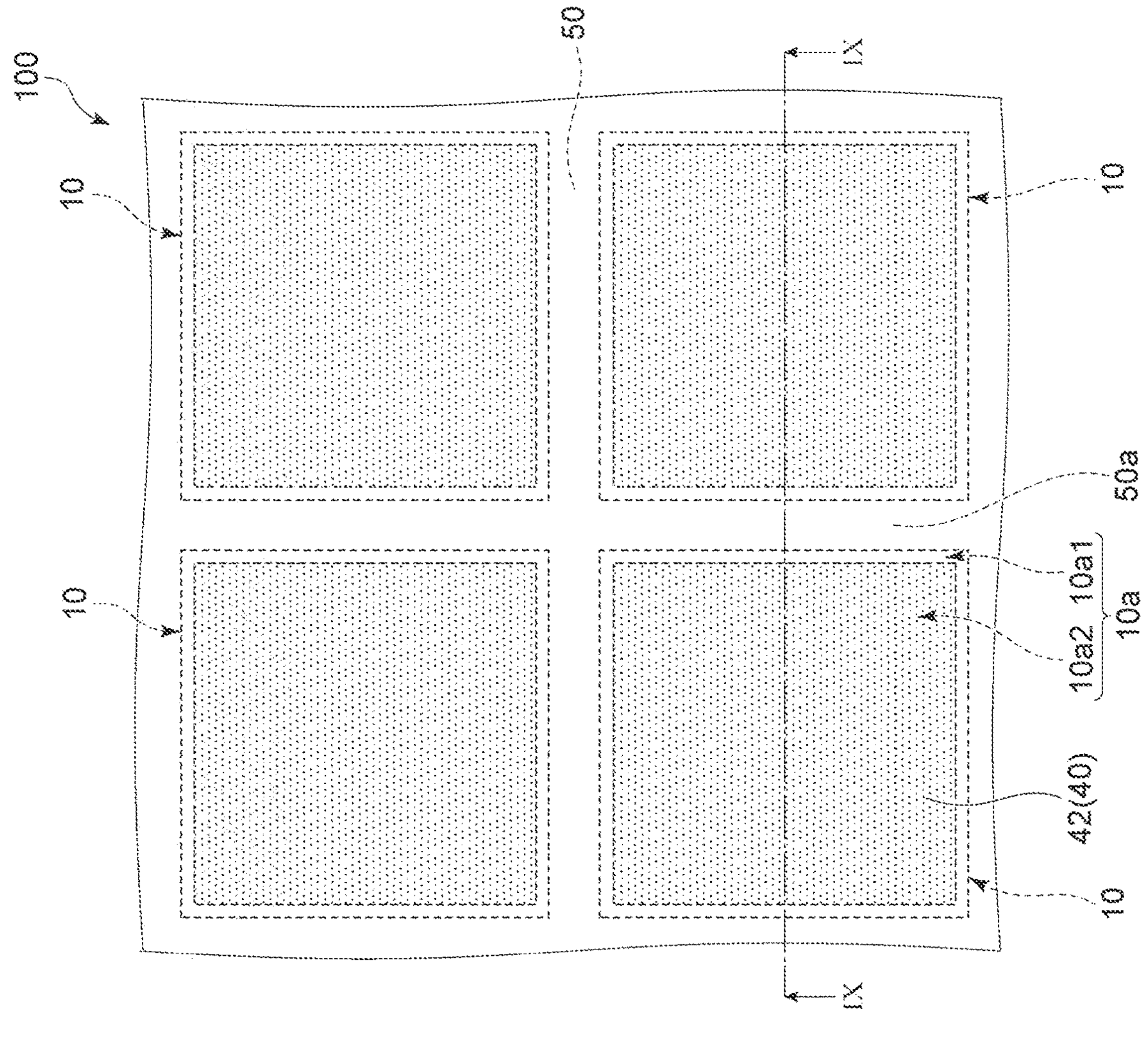
FIG. 10 is a schematic plan view explaining a step in the method of manufacturing a semiconductor element according to the embodiment of the present invention.

A method of manufacturing a semiconductor element according to one embodiment includes a step of providing a structure. FIG. 9 is a schematic cross-sectional view of a portion of a structure 100 in a form of a wafer. FIG. 10 is a schematic plan view of the structure 100. FIG. 9 is a cross-sectional view taken along line IX-IX in FIG. 10. In the schematic plan views in the present specification, the inner region 10*a*2 of the roughened first surface 10*a* of each semiconductor structure 10 to be described later is indicated by a dot hatch pattern.

The structure 100 includes a semiconductor structure 10, a resin member 50, and a first insulation film 40. The structure 100 can include a support member 102 that supports the semiconductor structure 10. A plurality of semiconductor structures 10 isolated from one another are supported on the support member 102 via the resin member 50.

For the support member 102, for example, sapphire, spinel ($MgAl_2O_4$), SiC, ZnS, ZnO, GaAs, or Si substrate can be used.

The semiconductor structure 10 is made of a nitride semiconductor. In the present specification, the term "nitride semiconductor" include semiconductors of all compositions with various composition ratios x and y in the respective ranges in the chemical formula $In_xAl_yGa_{1-x-y}N$ ($0 \le x \le 1$, $0 \le y \le 1$, $x+y \le 1$). The term "nitride semiconductor" further includes a semiconductor further containing a group V element other than N (nitrogen) in the chemical formula above and a semiconductor further containing various elements added in the chemical formula above to control various physical properties such as conductivity type.

The semiconductor structure 10 has a first semiconductor layer 11, a second semiconductor layer 13, and an active layer 12. The second semiconductor layer 13 is positioned between the first semiconductor layer 11 and the support member 102. The active layer 12 is located between the first semiconductor layer 11 and the second semiconductor layer 13. The active layer 12 is a light emitting layer that emits light and has, for example, a MQW (multiple quantum well) structure including multiple barrier layers and multiple well layers. The active layer 12 emits light having a peak wavelength of 210 nm to 580 nm, for example. The first semiconductor layer 11 has a semiconductor layer containing an n-type impurity, and the second semiconductor layer 13 has a semiconductor layer containing a p-type impurity, for example.

The semiconductor structure 10 has a first surface 10*a*, a second surface 10*b*, and a third surface 10*c*.

The upper surface of the first semiconductor layer 11 constitutes the first surface 10*a*. The first surface 10*a*, as shown in the plan view of FIG. 10, has a peripheral region 10*a*1, and a roughened inner region 10*a*2 positioned inward of the peripheral region 10*a*1.

The second surface 10*b* is positioned opposite the first surface 10*a*. The second surface 10*b* has a first region 10*b*1 and a second region 10*b*2. In the first region 10*b*1, a portion of the first semiconductor layer 11 is exposed from the second semiconductor layer 13 and the active layer 12. A surface of the first region 10*b*1 is a surface of the first semiconductor layer 11 opposite to a surface thereof at a side at which a substrate 101, to be described below, was located. A surface of the second region 10*b*2 is a surface of the second semiconductor layer 13 opposite to a surface thereof at a side at which the active layer 12 is located.

The third surface 10*c* connects the first surface 10*a* and the second surface 10*b*. The third surface 10*c* includes the lateral surface of the first semiconductor layer 11 connected to the first surface 10*a*. The third surface 10*c* further includes the lateral surface of the active layer 12 and the lateral surface of the second semiconductor layer 13.

The resin member 50 is disposed on the second surface 10*b* side and covers the second surface 10*b* and the third surface 10*c*. The resin member 50 is disposed between the second surface 10*b* and the support member 102, and between the third surface 10*c* and the support member 102. The resin member 50 includes at least one of epoxy, acrylic, and polyimide resins.

The first insulation film 40 is continuously disposed on the first surface 10*a* and the surface 50*a* of the resin member 50 adjacent to the first surface 10*a* in a plan view. The first insulation film 40 protects the first surface 10*a*. For the first insulation film 40, for example, $SiO_2$ can be used.

The structure 100 can further include a light transmissive conductive film 21, a first conductive film 23, a second conductive film 22, a first electrode 25, a second electrode 24, a metal film 26, a second insulation film 43, and a third insulation film 44.

The light transmissive conductive film 21 is disposed on the second region 10*b*2 of the second surface 10*b* and is in contact with the second semiconductor layer 13. The light transmissive conductive film 21 has the function of diffusing the electric current supplied via the second electrode 24 through the second semiconductor layer 13 in a planar direction. The transmittance of the light transmissive conductive film 21 with respect to the peak wavelength of the light from the active layer 12 is 60% or higher, preferably 70% or higher. For the light transmissive conductive film 21, for example, ITO (indium tin oxide), IZO (indium zinc oxide), ZnO, $In_2O_3$, or the like can be used. The thickness of the light transmissive conductive film 21 can be set, for example, to 10 nm to 500 nm.

The first conductive film 23 is disposed on the first region 10*b*1 of the second surface 10*b* and is in contact with the first semiconductor layer 11. The first conductive film 23 allows for reducing the contact resistance between the first electrode 25 and the first semiconductor layer 11.

The second conductive film 22 is disposed on the light transmissive conductive film 21 and is in contact with the light transmissive conductive film 21. The second conductive film 22 allows for reducing the contact resistance between the second electrode 24 and the light transmissive conductive film 21.

The first conductive film 23 and the second conductive film 22 can be, for example, a single metal layer of Ti, Rh, Au, Pt, Al, Ag, Rh, or Ru, or a multilayer structure containing at least two of these metal layers. The first conductive film 23 and the second conductive film 22 can be formed simultaneously using the same material.

The first electrode 25 is in contact with the first conductive film 23. The first electrode 25 is electrically connected to the first semiconductor layer 11 via the first conductive film 23.

The second electrode 24 is in contact with the second conductive film 22. The second electrode 24 is electrically connected to the second semiconductor layer 13 via the second conductive film 22 and the light transmissive conductive film 21.

The first electrode 25 and the second electrode 24 can contain, for example, Ti, Rh, Au, or a multilayer structure including two of these. The first electrode 25 and the second electrode 24 can be simultaneously formed using the same material. The thicknesses of the first electrode 25 and the second electrode 24 can be set, for example to 10 nm to 500 nm.

The third insulation film 44 covers the second surface **10*b* and the light transmissive conductive film 21. The third insulation film 44 can be a film having reflectivity with respect to the light from the active layer 12. The reflectance of the third insulation film 44 with respect to the light emitted by the active layer 12 is 60% or higher, preferably 70% or higher. The third insulation film 44 includes, for example, a dielectric multilayer film. A dielectric multilayer film include, for example a $SiO_2$ layer and a $Nb_2O_5$ layer that are alternately layered. For the third insulation film 44, for example, a relatively thick $SiO_2$ layer of 100 nm to 500 nm in thickness is preferably formed, followed by forming thereon as a dielectric multilayer film two to six pairs of an $Nb_2O_5$ layer of 10 nm to 100 nm in thickness and a $SiO_2$ layer of 10 nm to 100 nm in thickness. Setting the thickness of each layer and the number of layers for the third insulation film 44 as described above allows for having good reflectivity. For example, for the third insulation film 44, a $SiO_2$ layer of 300 nm in thickness can be formed before forming thereon three pairs of a $Nb_2O_5$ layer of 52 nm in thickness and a $SiO_2$ layer of 83 nm in thickness. For the third insulation film 44**, materials such as $TiO_2$, $ZrO_2$, $Al_2O_3$, AlN, and the like can be used.

The metal film 26 is disposed in contact with the third insulation film 44. The metal film 26 has reflectivity with respect to the light emitted by the active layer 12. The metal film 26 includes, for example, Al, Ti, or a multilayer structure including these. The reflectivity of the metal film 26 with respect to the peak wavelength of the light from the active layer 12 is 60% or higher, preferably 70% or higher.

The second insulation film 43 is disposed on the third surface **10*c* covering the third surface 10*c*. The resin member 50 covers the third surface 10*c* via the second insulation film 43. The second insulation film 43 is disposed on the second surface 10*b* side, covering the third insulation film 44 and the metal film 26. For the second insulation film 43**, for example, $SiO_2$, SiON, or SiN can be used.

The first electrode 25 is in contact with the first conductive film 23 and disposed on the second insulation film 43. The second electrode 24 is in contact with the second conductive film 22 and disposed on the second insulation film 43.

The step of providing a structure can include the steps shown in FIG. 1 to FIG. 8. Each step shown in FIG. 1 to FIG. 8 will be explained below. In the step of providing a structure, the structure 100 shown in FIG. 9 and FIG. 10 can be provided by purchasing.

In the step shown in FIG. 1, a semiconductor structure 10 is formed on a substrate 101. A first semiconductor layer 11, an active layer 12, and a second semiconductor layer 13 are successively formed on the substrate 101 by, for example, MOCVD (metalorganic chemical vapor deposition).

For the substrate 101, for example, an insulation substrate, such as sapphire in which C-plane, R-plane, or A-plane is a principal plane, or spinel can be used. For the substrate 101, a conductive substate, such as SiC (including 6H, 4H, and 3C), ZnS, ZnO, GaAs, Si or the like may be used. In this embodiment, a sapphire substrate in which C-plane is a principal plane is used for the substrate 101.

For example, after forming a semiconductor structure 10 on a substrate 101 by MOCVD, a light transmissive conductive film 21 is formed on the second semiconductor layer 13 by sputtering. Subsequently, a first region **10*b*1 and a second region 10*b*2 are formed on the second surface 10*b* by removing a portion of the second semiconductor layer 13 and a portion of the active layer 12 by etching. Then, a first conductive film 23, a second conductive film 22, a third insulation film 44, a metal film 26, a second insulation film 43, a first electrode 25, and a second electrode 24 are formed by sputtering. For example, after forming the first conductive film 23, the second conductive film 22, and the third insulation film 44, a groove 81 is created in the semiconductor structure 10 by removing a portion of the second semiconductor layer 13, a portion of the active layer 12, and a portion of the first semiconductor layer 11 by etching. The groove 81 does not reach the substrate 101. In other words, a bottom surface among the surfaces that define the groove 81 is a surface of the semiconductor structure 10. A portion of the first semiconductor layer 11 remains between the groove 81 and the first surface 10*a***.

Subsequent to forming a groove 21, a second insulation film 43 is formed. The second insulation film 43 covers the third surfaces **10*c* of the semiconductor structure 10, which are lateral surfaces among the surfaces that define the groove 81, and the fourth surface 10*d* of the semiconductor structure 10, which is the bottom surface among the surfaces that define the groove 81**.

Figure 2:
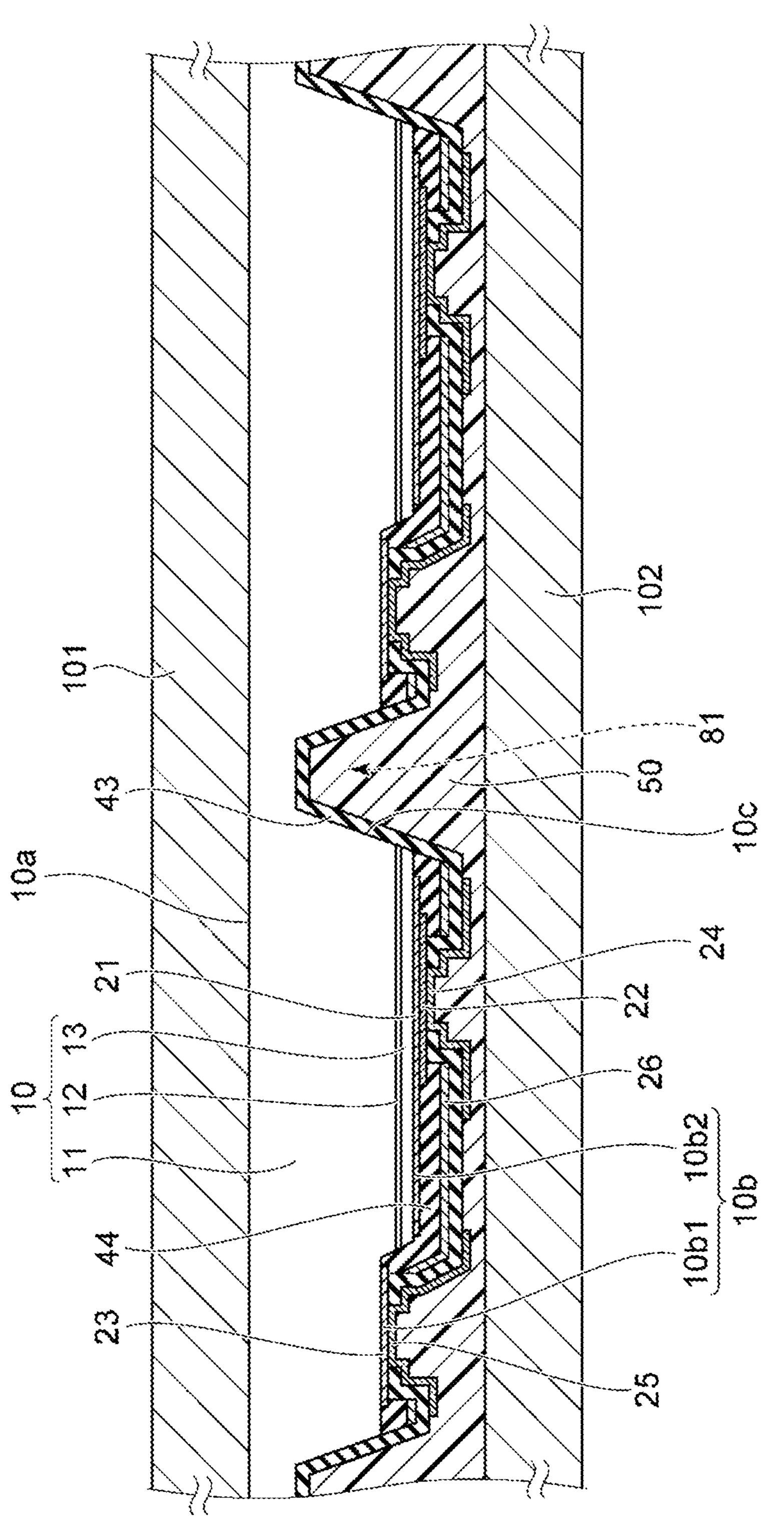
FIG. 2 is a schematic cross-sectional view explaining a step in the method of manufacturing a semiconductor element according to the embodiment of the present invention.

Subsequent to the step shown in FIG. 1, the second surface **10*b* side of the semiconductor structure 10 is bonded to a support member 102 via a resin member 50 as shown in FIG. 2. The resin member 50 covers the first electrode 25, the second electrode 24, and the second insulation film 43 on the second surface 10*b* side. Moreover, the resin member 50 which is also disposed in the groove 81 covers the second insulation film 43 in the groove 81. In FIG. 2, the positional relationship between the substrate 101 and the semiconductor structure 10 is inverted from that shown in FIG. 1**.

Figure 3:
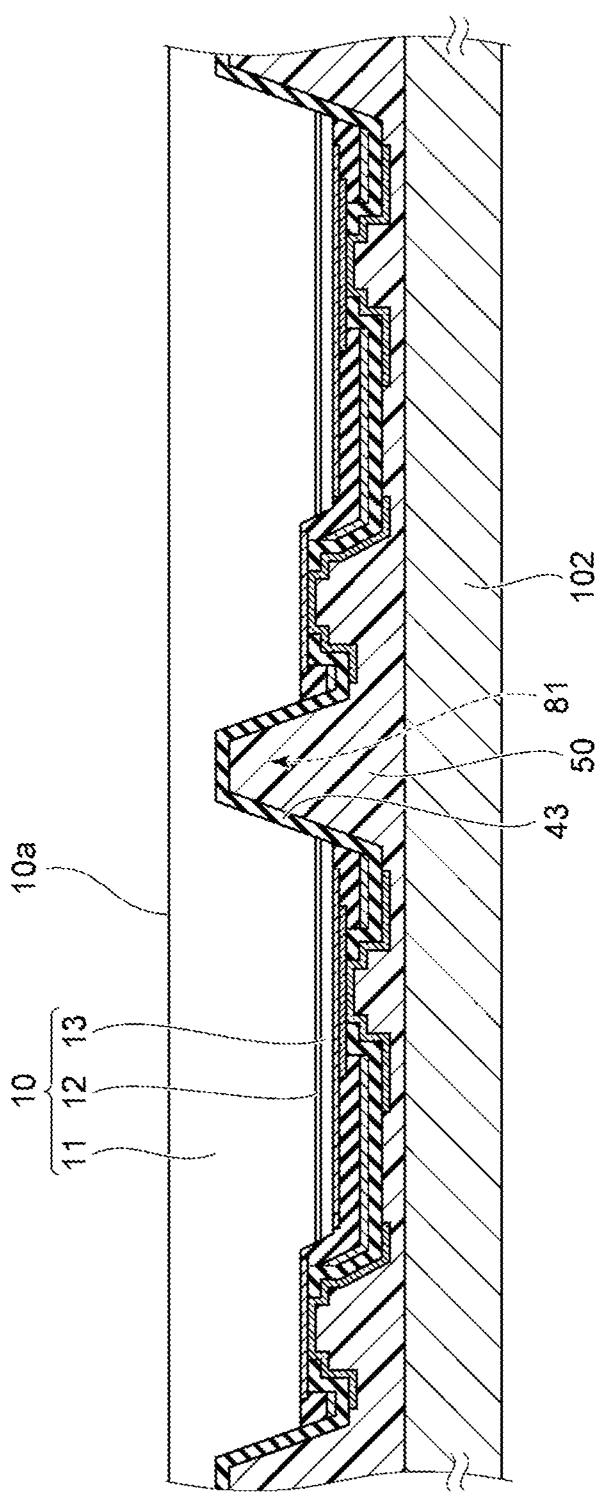
FIG. 3 is a schematic cross-sectional view explaining a step in the method of manufacturing a semiconductor element according to the embodiment of the present invention.

After bonding the semiconductor structure 10 to the support member 102, the semiconductor structure 10 and the substrate 101 are separated to expose the first surface **10*a* of the semiconductor structure 10 as shown in FIG. 3. The substrate 101** is removed by using a technique such as LLO (laser lift off), grinding, polishing, etching, or the like.

Figure 4:
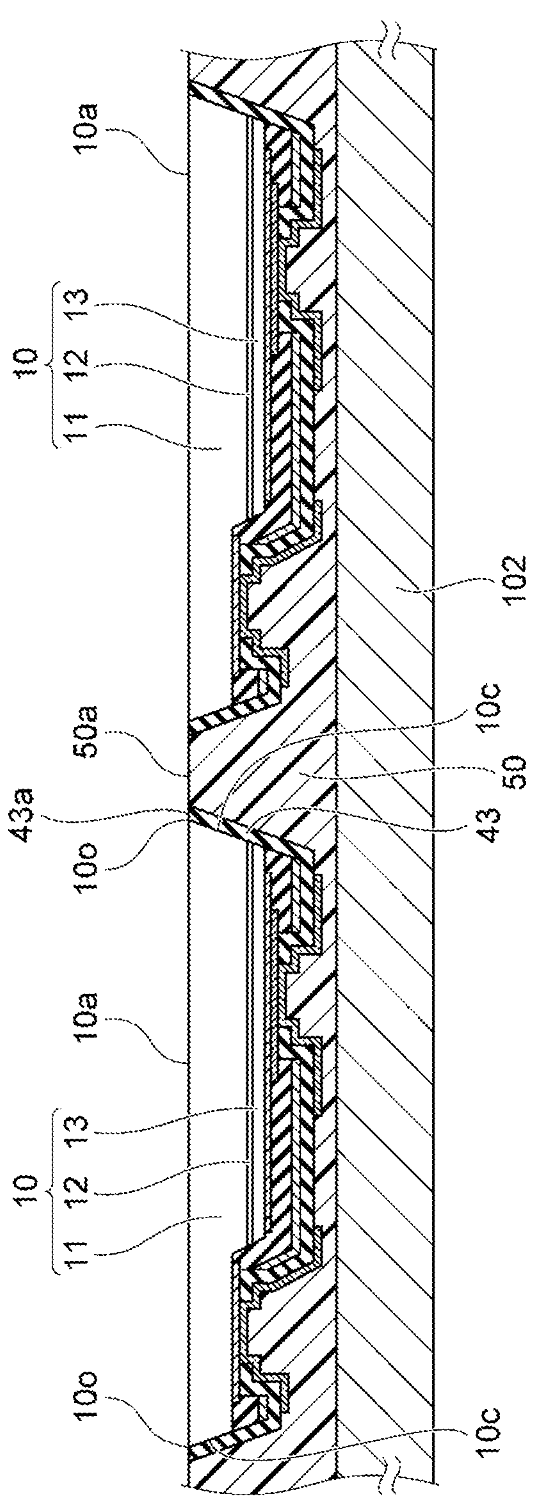
FIG. 4 is a schematic cross-sectional view explaining a step in the method of manufacturing a semiconductor element according to the embodiment of the present invention.

Subsequent to exposing the first surface 10*a* of the semiconductor structure 10, the flatness of the first surface 10*a* is increased by partly removing the first semiconductor layer 11 by, for example, CMP (chemical mechanical polishing) or RIE (reactive ion etching). In the present specification, the first surface 10*a* with increased flatness is also referred to as first surface 10*a*. In increasing the flatness of the first surface 10*a*, the first semiconductor layer 11 is removed such that the first semiconductor layer 11 located above the groove 81 is eliminated. This separates the semiconductor structures 10 into individual parts as shown in FIG. 4. The surface 50*a* of the resin member 50 and the surface 43*a* of the second insulation film 43 on the third surface 10*c* are exposed between two adjacent semiconductor structures 10. Moreover, this separation forms outer edges 10*o* of the first surface 10*a* that is connected to the third surface 10*c*.

Figure 5:
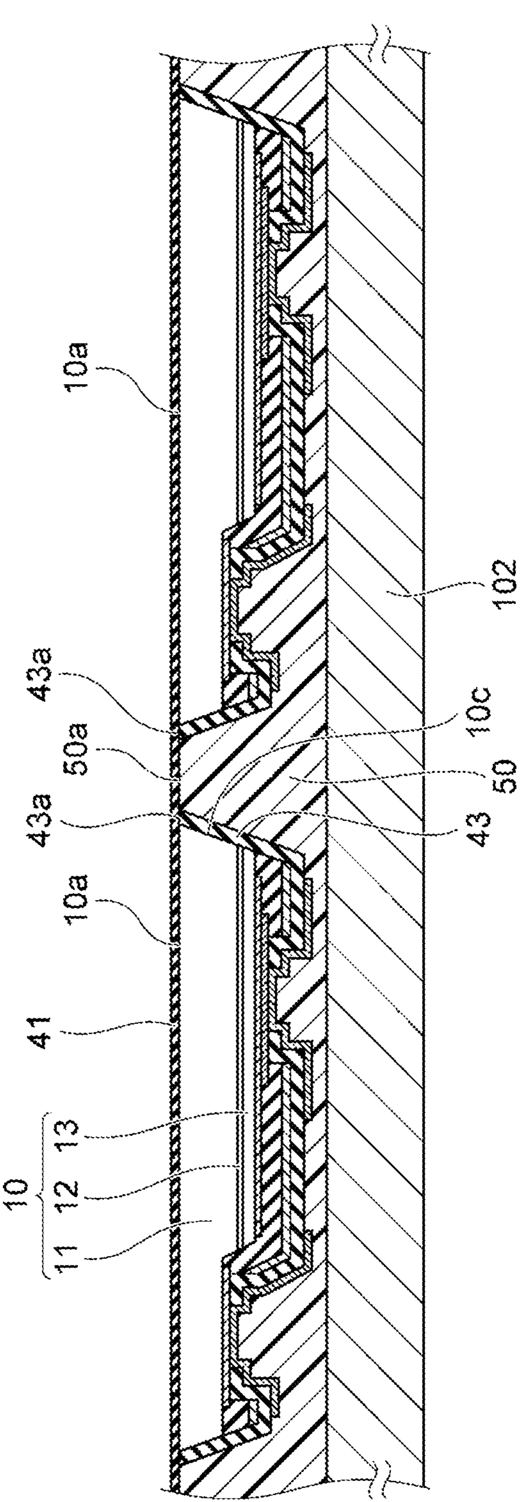
FIG. 5 is a schematic cross-sectional view explaining a step in the method of manufacturing a semiconductor element according to the embodiment of the present invention.

After separating the semiconductor structures 10 into separates parts, a first film 41 is formed to be continuous on the first surface 10*a*, the surface 43*a* of the second insulation film 43, and the surface 50*a* of the resin member 50 as shown in FIG. 5. The first film 41 is formed, for example, by sputtering or CVD (chemical vapor deposition). For the first film 41, for example, $SiO_2$, SiON, or SiN can be used.

Figure 6:
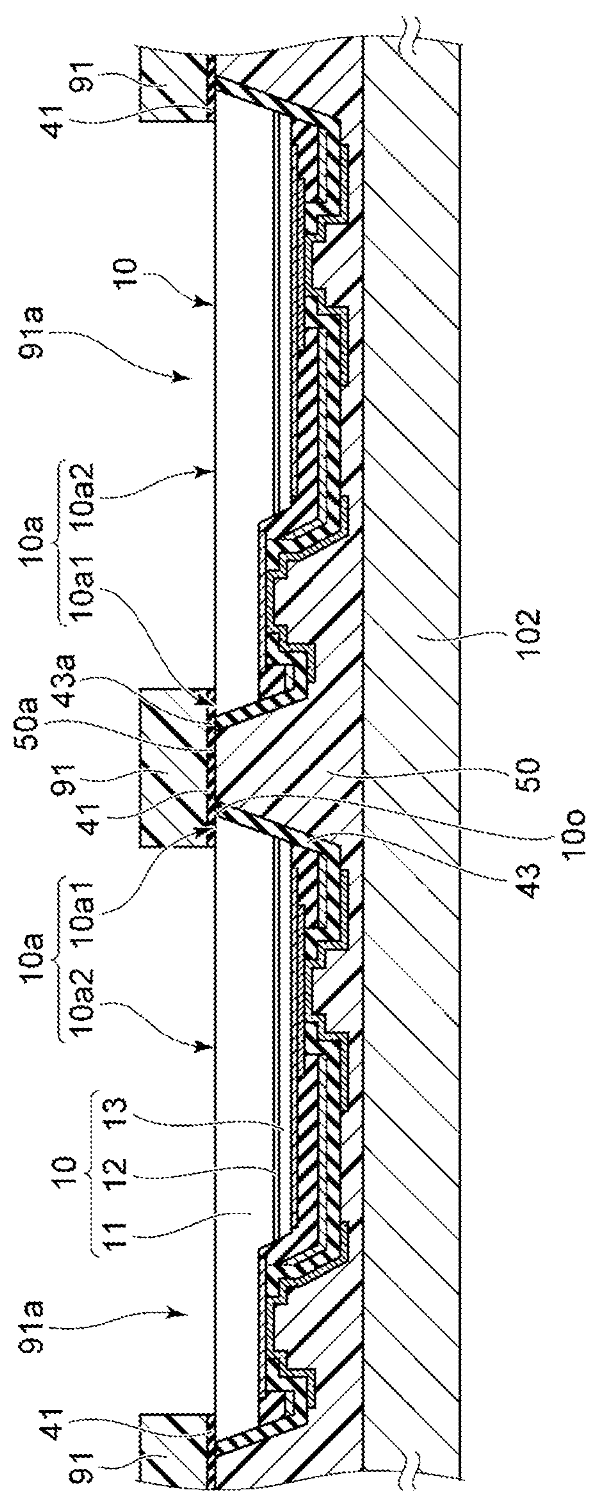
FIG. 6 is a schematic cross-sectional view explaining a step in the method of manufacturing a semiconductor element according to the embodiment of the present invention.

After forming the first film 41, the inner region 10*a*2 of the first surface 10*a* is exposed from the first film 41 as shown in FIG. 6. First, a mask 91 is formed on the first film 41 in the state shown in FIG. 5. Then a plurality of openings 91*a* are formed in the mask 91. In the state in which the mask 91 has a plurality of openings 91*a*, the mask 91 covers the first film 41 on the peripheral region 10*a*1 of the first surface 10*a*, the first film 41 on the surface 43*a* of the second insulation film 43, and the first film 41 on the surface 50*a* of the resin member 50. The mask 91 in such a state can be formed, for example, by forming a mask 91 which is a resist film on the first film 41 in the state shown in FIG. 5, followed by performing exposure and developing process on the mask 91. Subsequently, the first film 41 exposed in the openings 91*a* is removed by etching using the mask 91. This exposes the inner region 10*a*2 of each first surface 10*a* from the first film 41 at each opening 91*a*.

Figure 7:
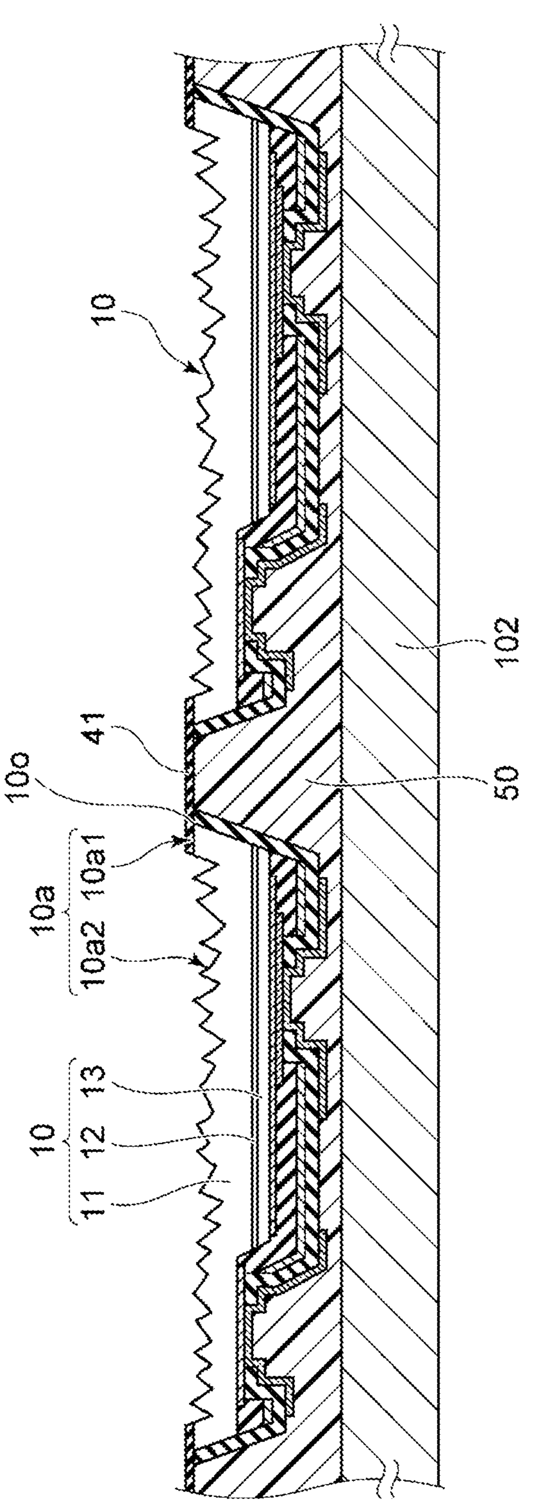
FIG. 7 is a schematic cross-sectional view explaining a step in the method of manufacturing a semiconductor element according to the embodiment of the present invention.
Figure 8:
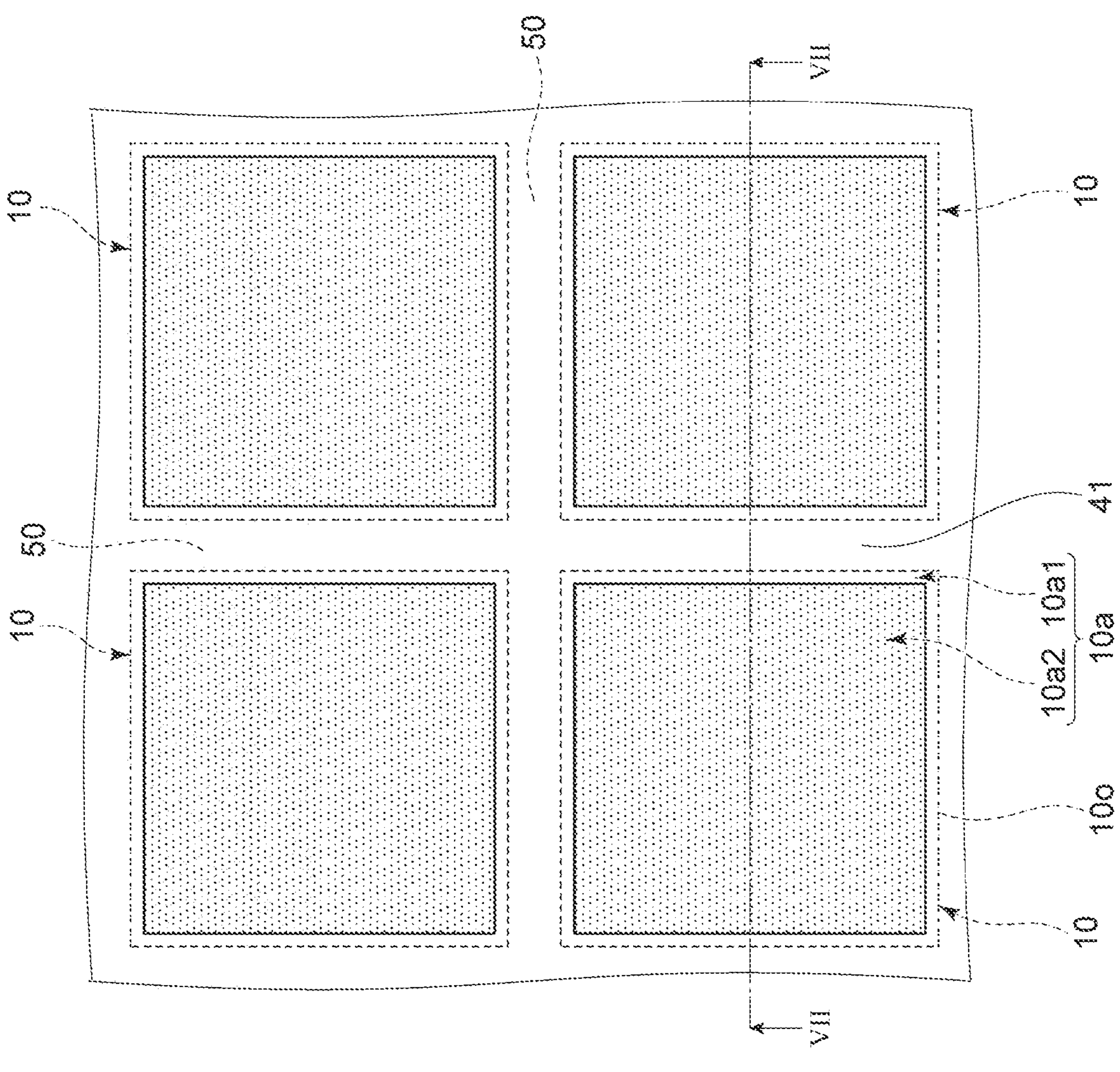
FIG. 8 is a schematic plan view explaining a step in the method of manufacturing a semiconductor element according to the embodiment of the present invention.

Subsequently, the mask 91 is removed. After removing the mask 91, the surface of the inner region 10*a*2 of the first surface 10*a* exposed from the first film 41 is roughened as shown in FIG. 7 and FIG. 8. This allows for improving the efficiency of extracting light from the roughened inner region 10*a*2. The roughened inner region 10*a*2 includes a plurality of protrusions. For example, the surface of the inner region 10*a*2 is roughened by dry etching with a gas containing chlorine, or wet etching with an alkaline solution such as TMAH (tetramethylammonium hydroxide), or the like.

As shown in FIG. 8, the peripheral region 10*a*1 continuously surrounds the inner region 10*a*2 in the plan view. The peripheral region 10*a*1 is preferably a region within a distance of 10 μm or less, for example, more preferably a region within a distance of 5 μm or less, from the outer edges 10*o* of the first surface 10*a* in the plan view.

After roughening the surface of the inner region 10*a*2, a second film 42 is formed to be continuous on the first film 41 and the inner region 10*a*2 as shown in FIG. 9 and FIG. 10. Thus, a structure 100 is provided. The second film 42 is formed, for example, by sputtering or CVD. The second film 42 has light transmissivity with respect to the light emitted by the active layer 12. For the second film 42, for example, $SiO_2$, SiON, or SiN can be used. The upper surface of the second film 42 conforms to the projections of the roughened inner region 10*a*2. This allows for improving the efficiency in extracting light from the inner region 10*a*2 via the second film 42.

Roughening the first surface 10*a* entirely would make the first semiconductor layer 11 more susceptible to chipping at the outer edge of the first surface 10*a*. In this embodiment, the roughening is performed in the state in which the peripheral region 10*a*1 is covered by the first film 41, so that the peripheral region 10*a*1 of the first surface 10*a* is not roughened. This can make the first semiconductor layer 11 less susceptible to chipping in the peripheral portion of the first surface 10*a*.

Step of Forming Cover Member

Figure 11:
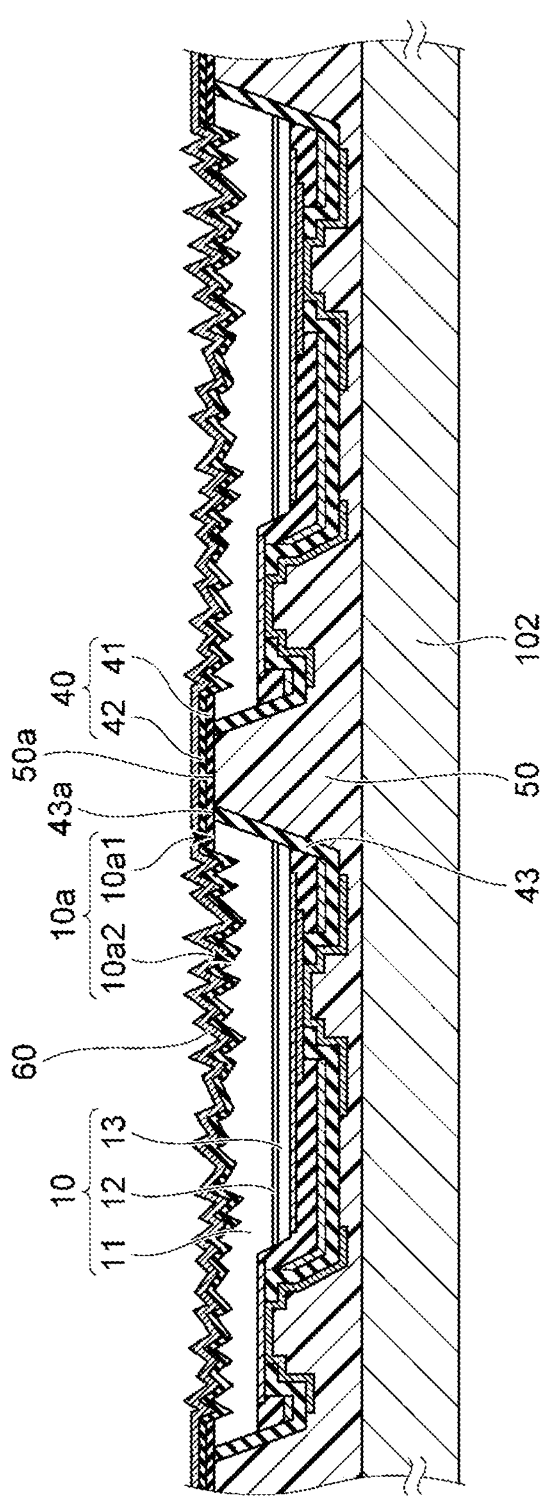
FIG. 11 is a schematic cross-sectional view explaining a step in the method of manufacturing a semiconductor element according to the embodiment of the present invention.
Figure 12:
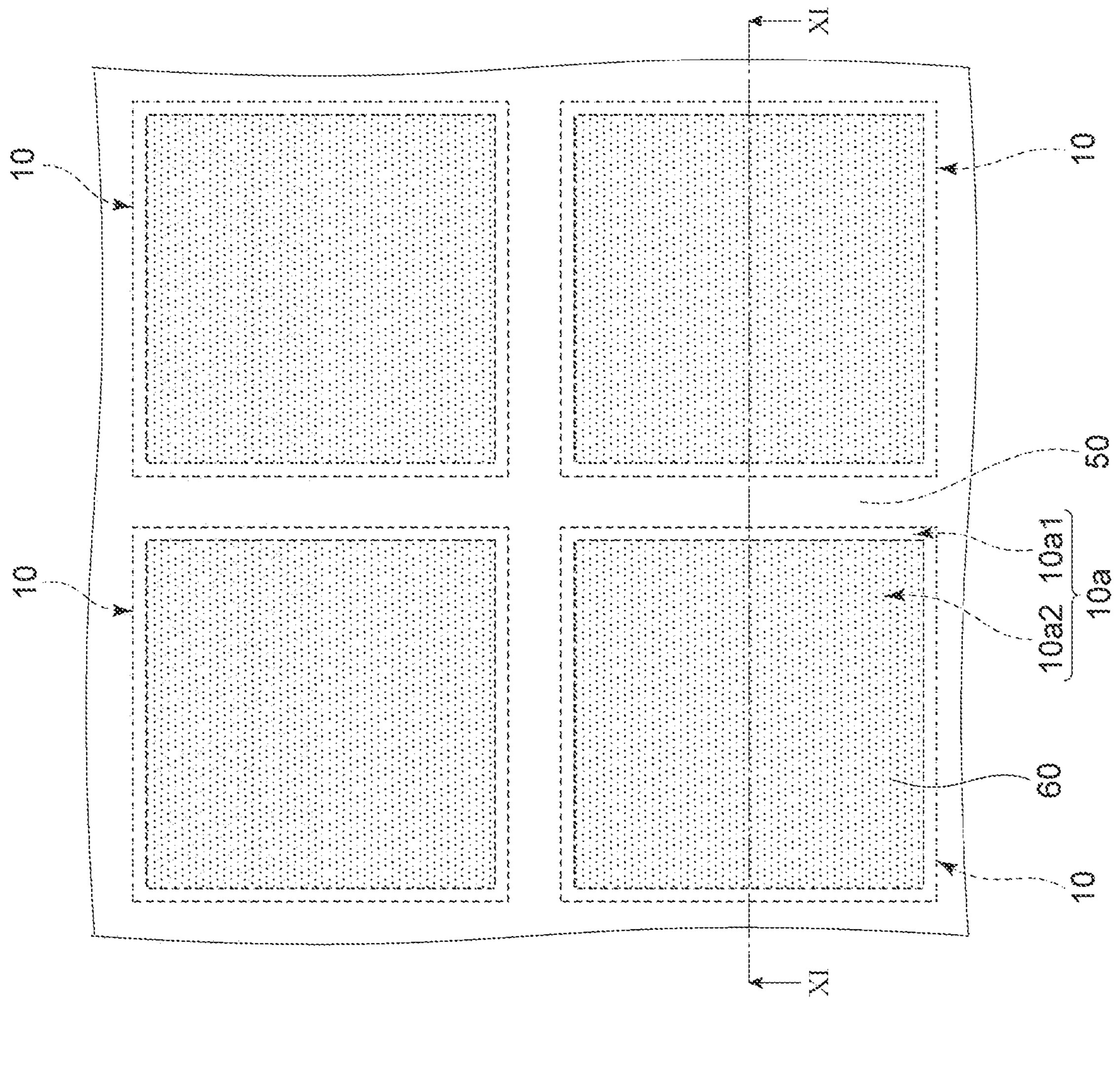
FIG. 12 is a schematic plan view explaining a step in the method of manufacturing a semiconductor element according to the embodiment of the present invention.

The method of manufacturing a semiconductor element according to this embodiment includes a step of forming a cover member 60 as shown in FIG. 11 and FIG. 12 subsequent to the step of providing a structure 100. The cover member 60 is formed to be continuous on a portion of the first insulation film located on the first surface 10*a*, a portion of the first insulation film 40 located on the surface 43*a* of the second insulation film 43, and a portion of the first insulation film 40 located on the surface 50*a* of the resin member 50.

For the cover member 60, for example, a metal film can be used. The cover member 60 is formed by, for example, sputtering. The thickness of the cover member 60 is, for example, 50 nm to 1 μm.

Step of Removing a Portion of Cover Member Located on the Surface of Resin Member The method of manufacturing a semiconductor element according to this embodiment includes a step of removing a portion of the cover member 60 located on the surface 50*a* of the resin member 50 subsequent to the step of forming a cover member 60.

Figure 13:
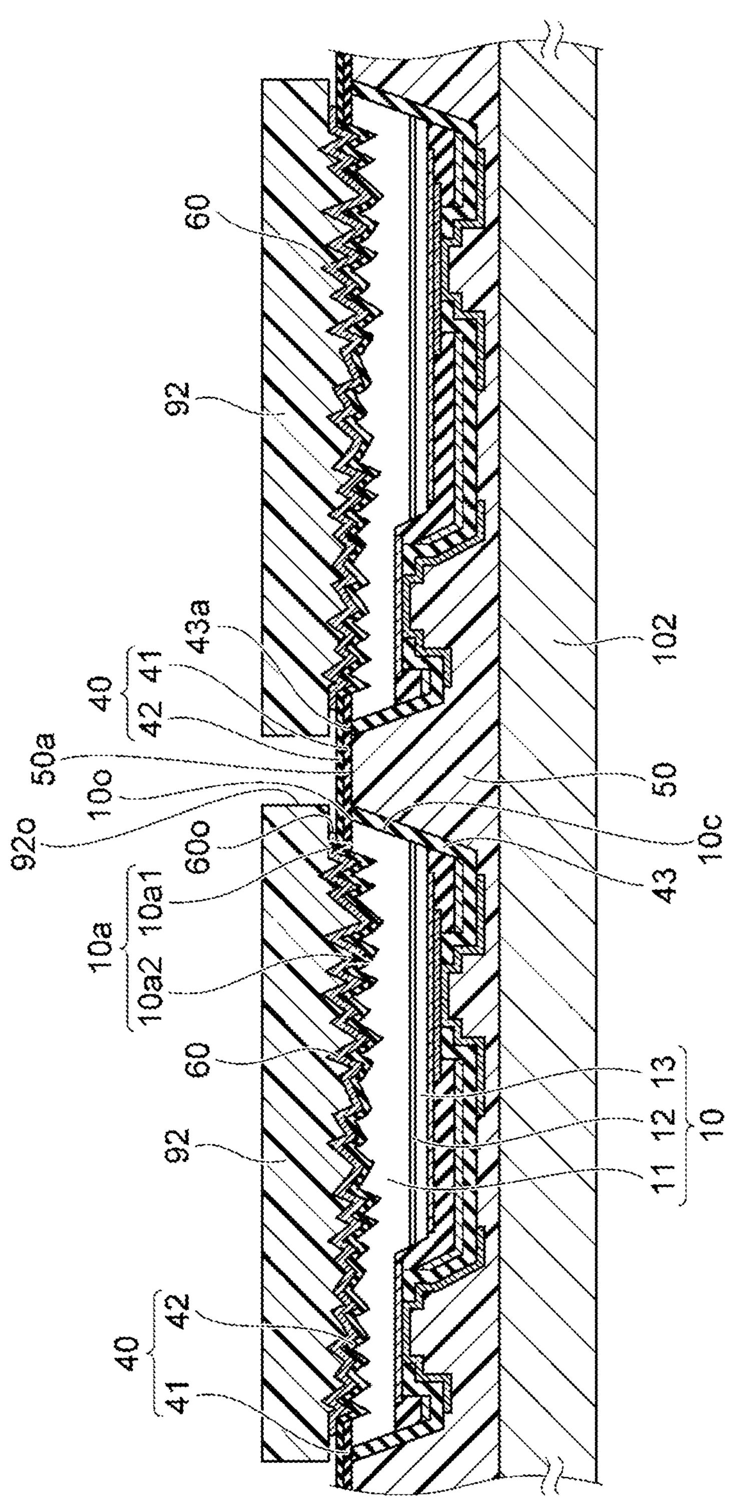
FIG. 13 is a schematic cross-sectional view explaining a step in the method of manufacturing a semiconductor element according to the embodiment of the present invention.
Figure 14:
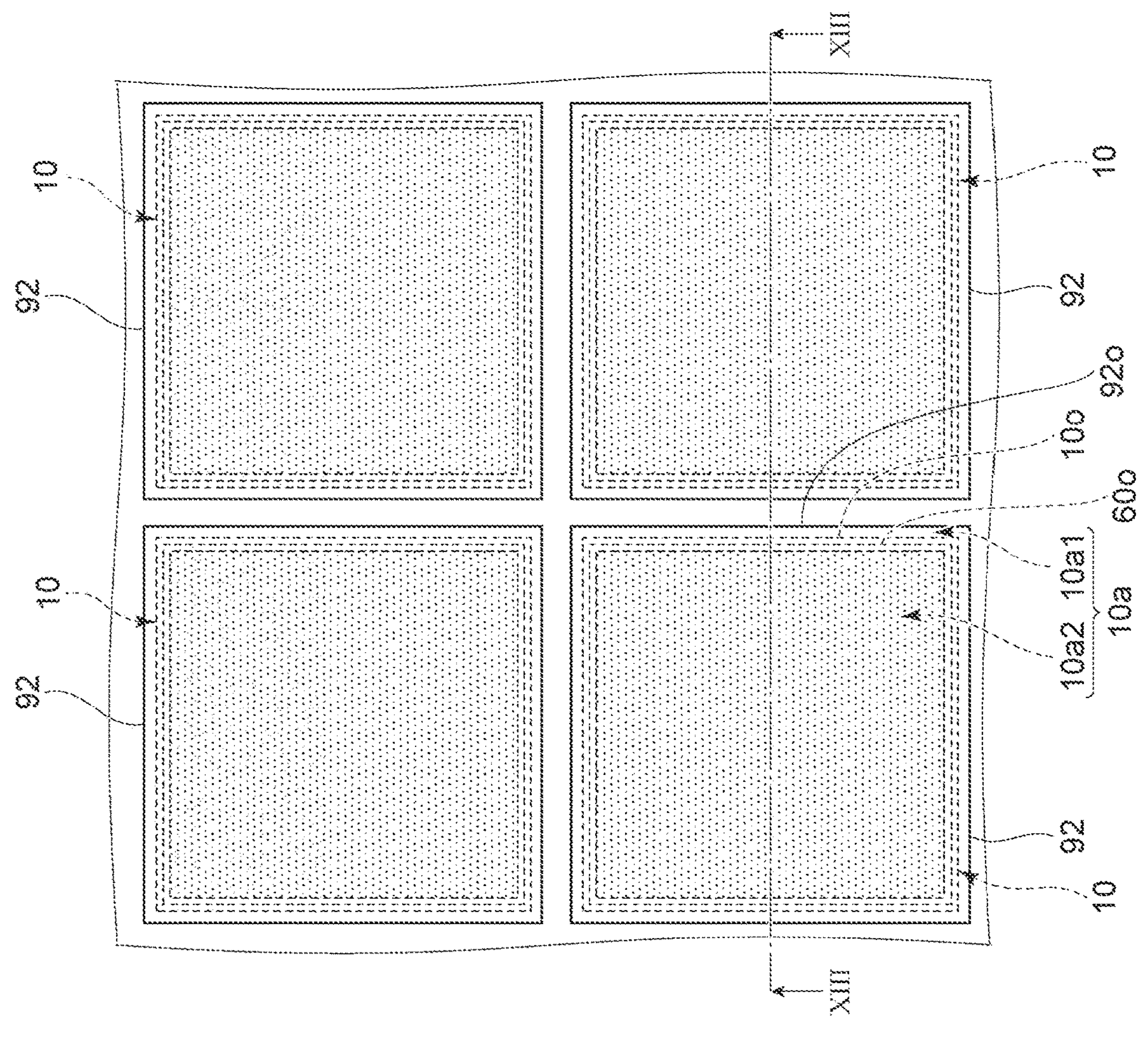
FIG. 14 is a schematic plan view explaining a step in the method of manufacturing a semiconductor element according to the embodiment of the present invention.

A resist film 92 is formed on the cover member 60 such that the portion of the cover member 60 that is located on the surface 50*a* of the resin member 50 is exposed from the resist 92 as shown in FIG. 13 and FIG. 14. Using the resist film 92 as a mask, the portion of the cover member 60 located on the surface 50*a* of the resin member 50 is removed, with the cover member remaining on the first insulation film 40 located on the first surface 10*a*. The details of this step will be described later.

Step of Removing a Portion of First Insulation Film and a Portion of Resin Member That Are Located in Region Not Overlapping Cover Member The method of manufacturing a semiconductor element according to this embodiment includes, subsequent to the step of removing the portion of the cover member 60 located on the surface 50*a* of the resin member 50, a step of removing a portion of the first insulation film 40 and a portion of the resin member 50 that are located in a region not overlapping the cover member 60 in a plan view by etching using the cover member 60 as a mask.

In the state in which the resist film 92 remains on the cover member 60, a portion of the first insulation film 40 is removed.

Figure 15:
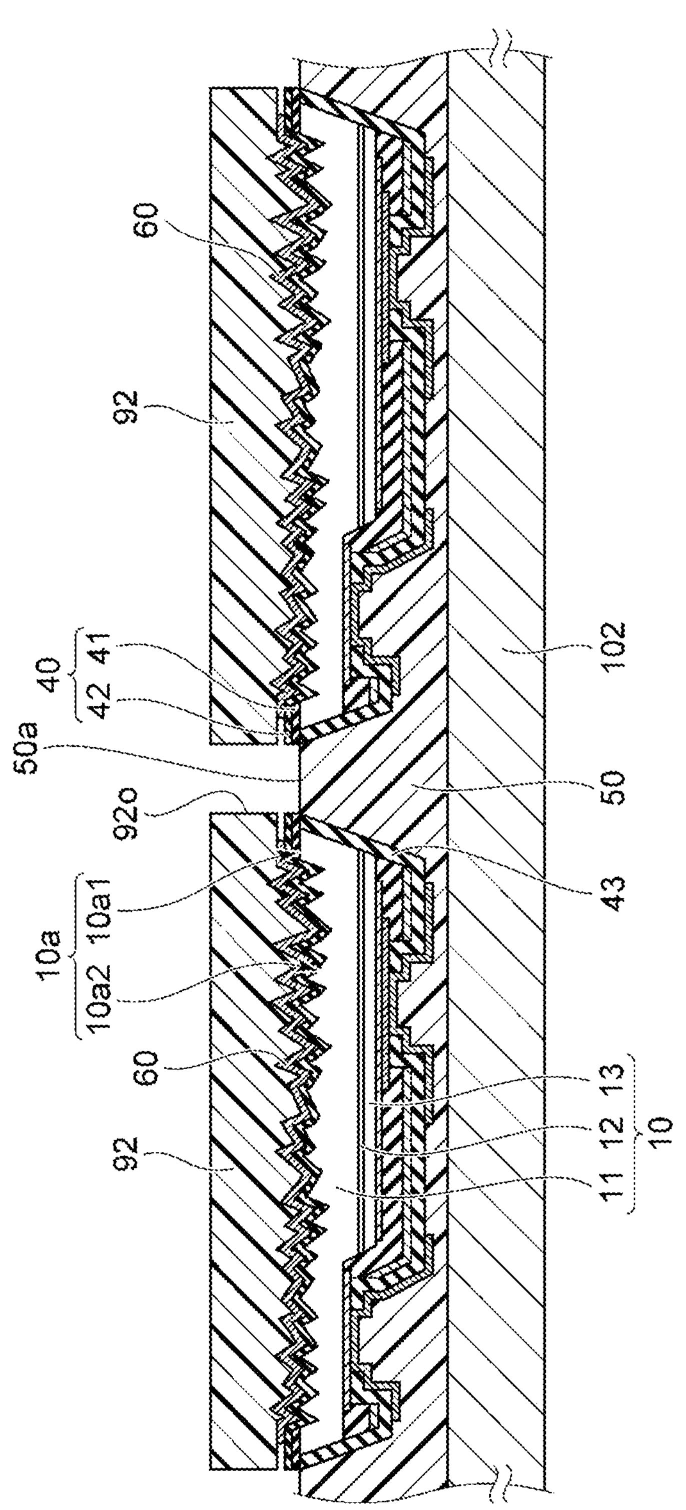
FIG. 15 is a schematic cross-sectional view explaining a step in the method of manufacturing a semiconductor element according to the embodiment of the present invention.

In FIG. 14, the outer edges 92*o* of each resist film 92 is indicated with a solid line. In FIG. 14, a portion of the first insulation film 40 located on the surface 50*a* of the resin member 50 and exposed from the resist film 92 is removed. The portion of the first insulation film 40 is removed by dry etching using a gas containing fluorine, for example. The removal of the portion of the first insulation film 40 from the surface 50*a* of the resin member 50 causes the surface 50*a* of the resin member 50 to be exposed from the resist film 92, the cover member 60, and the first insulation film 40 as shown in FIG. 15.

Figure 16:
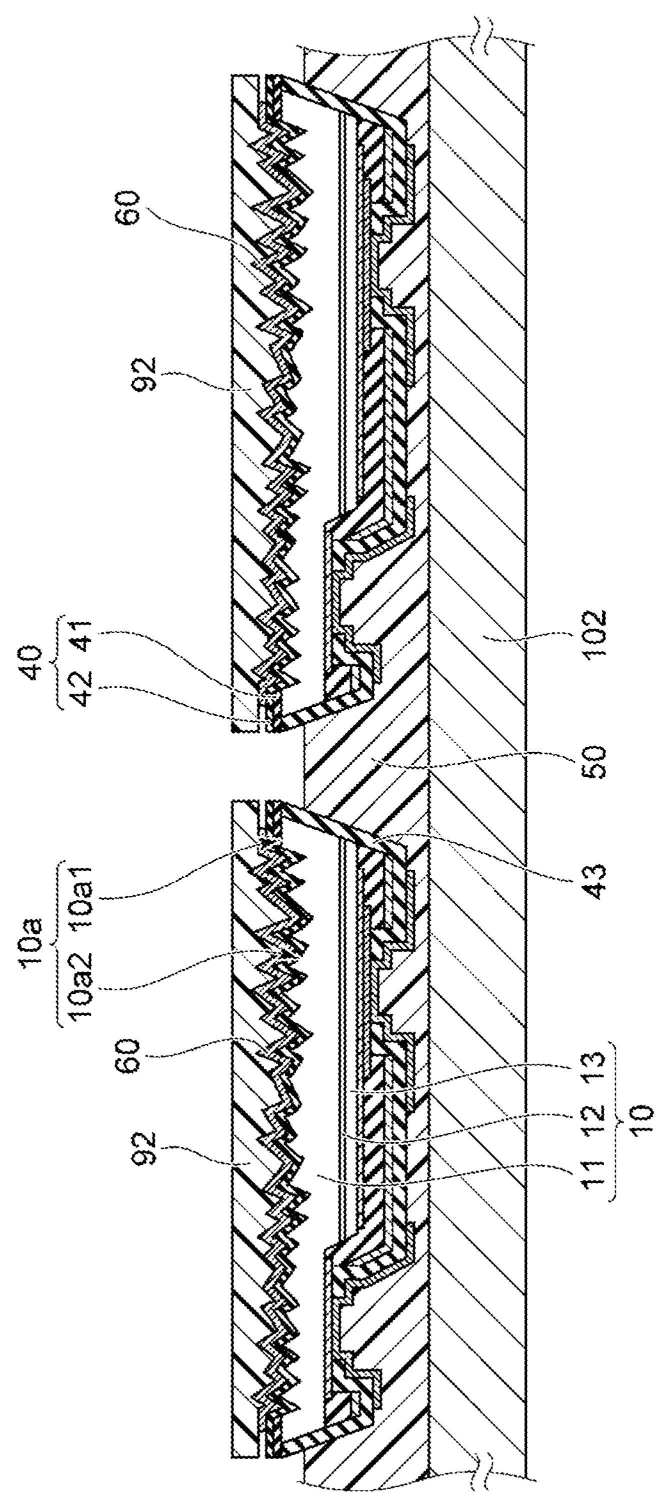
FIG. 16 is a schematic cross-sectional view explaining a step in the method of manufacturing a semiconductor element according to the embodiment of the present invention.

Subsequently, etching is performed on the resin member 50 from the exposed surface 50*a*. For example, the resin member 50 is removed by dry etching using a gas containing oxygen, for example. At this time, the resist film 92 is removed together with the resin member 50 as shown in FIG. 16.

In this step, the etch rate for the cover member 60 is lower than the etch rate for the resist film 92. In other words, in this step, the cover member 60 has higher etch resistance than that of the resist film 92. If the cover member 60 were not formed, the resist film 92 might be eliminated during the etching of the resin member 50 which could expose the upper surface of the first insulation film 40. If the upper surface of the first insulation film 40 were exposed, the first insulation film 40 would also be removed during the etching of the resin member 50, which could expose the first surface 10*a* of the semiconductor structure from the first insulation film 40. One conceivable technique to prevent this is to increase the thickness of the resist film 92, but increase in thickness of a resist film 92 may cause reduction in the positioning accuracy of the resist film 92. Another conceivable technique is to increase the thickness of the first insulation film 40 such that the first surface 10*a* would not be exposed from the first insulation film 40 when etching the resin member 50. However, increase in thickness of the first insulation film 40 may reduce the efficiency in extraction of light from the first surface 10*a* via the first insulation film 40.

According to this embodiment, in which a cover member 60 is formed on the first surface 10*a*, the first insulation film 40 is covered by the cover member 60 even if the resist film 92 is eliminated during the etching of the resin member 50. Accordingly, the first insulation film 40 is protected by the cover member 60 when etching the resin member 50.

This makes it more difficult for the first surface 10*a* to become exposed from the first insulation film 40. This can provide a method of manufacturing a semiconductor element of high reliability. According to this embodiment, moreover, a method of manufacturing a semiconductor element of high reliability in the first surface 10*a* is covered and protected by an insulation film 40 can be provided while reducing the degradation of positioning accuracy of the resist film 92 attributable to increase in thickness of the resist film 92 and the degradation of light extraction efficiency attributable to increase in thickness of the first insulation film 40.

Figure 17:
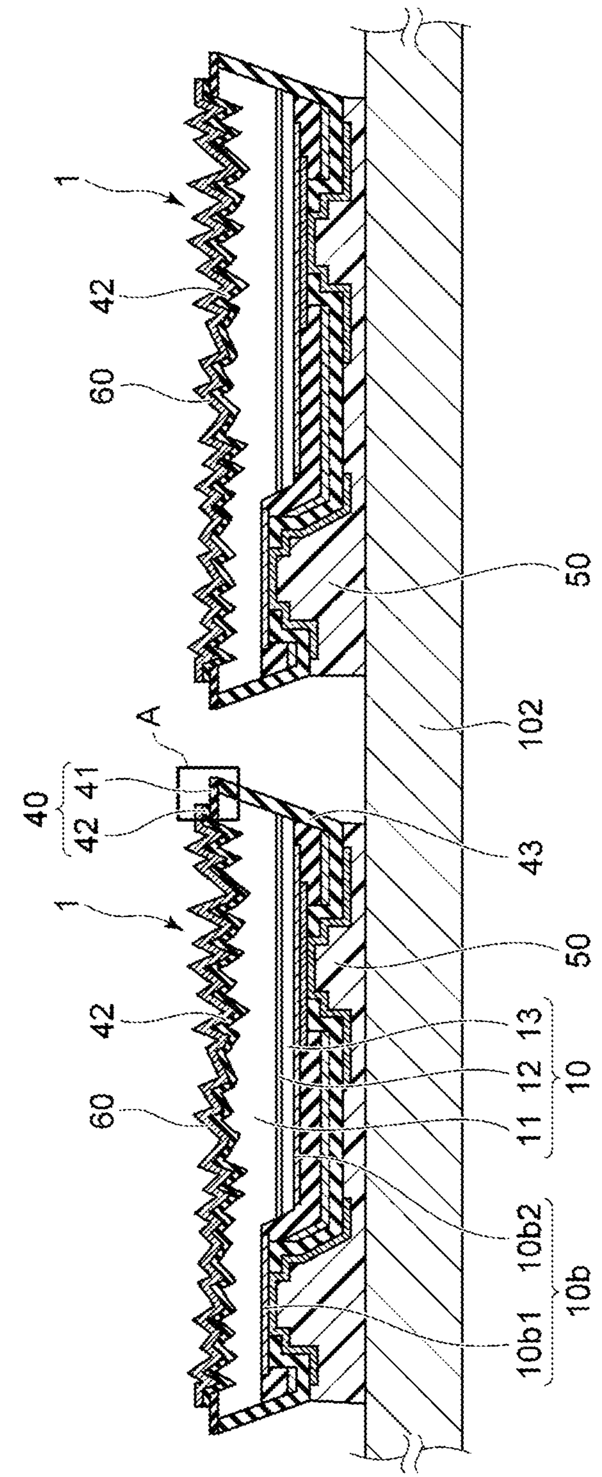
FIG. 17 is a schematic cross-sectional view explaining a step in the method of manufacturing a semiconductor element according to the embodiment of the present invention.
Figure 18:
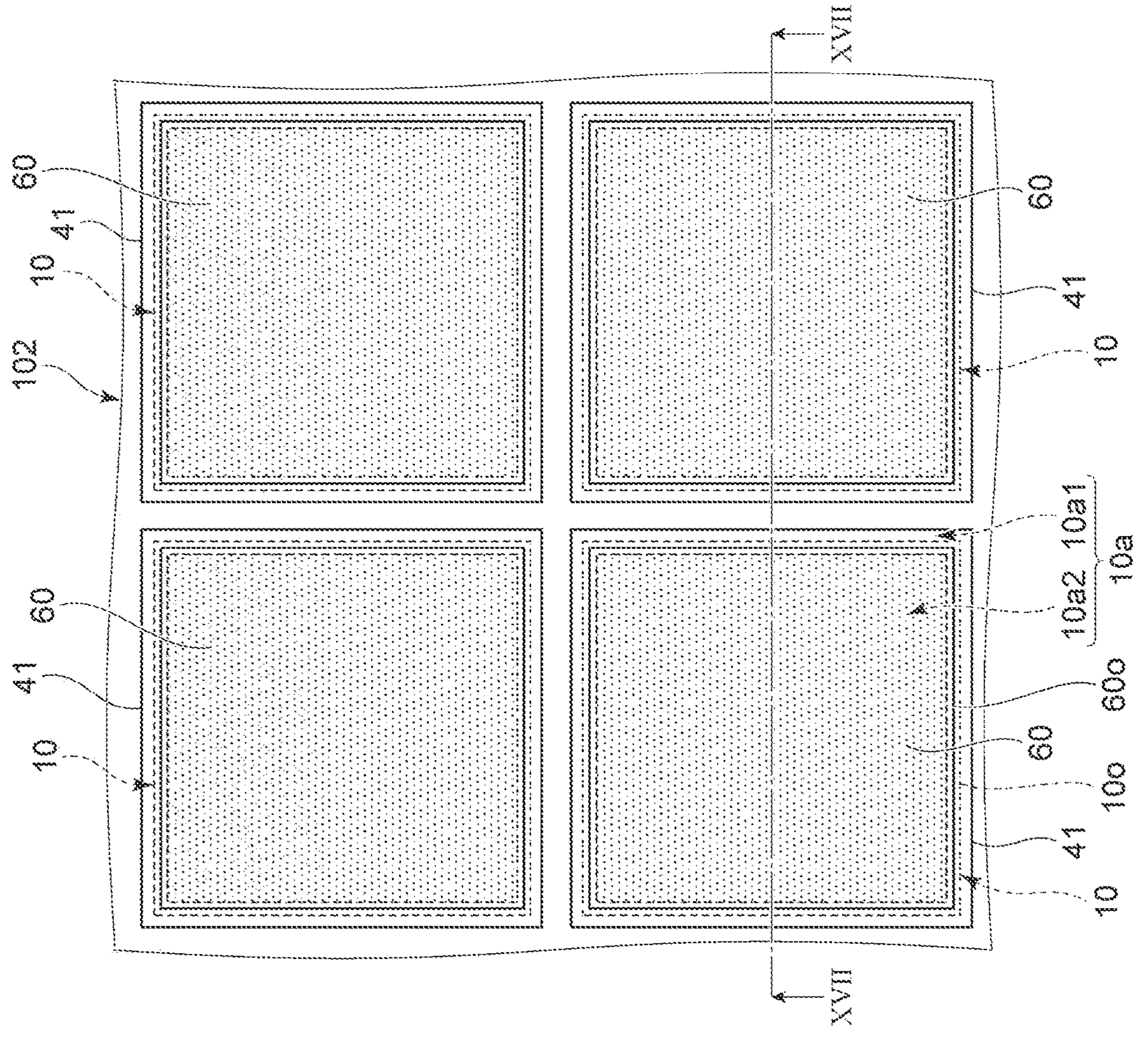
FIG. 18 is a schematic plan view explaining a step in the method of manufacturing a semiconductor element according to the embodiment of the present invention.

As shown in FIG. 17 and FIG. 18, a portion of the resin member 50 located in a region not overlapping the cover member 60 is removed. The resin member 50 in the region overlapping the cover member 60, i.e., a portion of the resin member 50 on the second surface 10*b* side, remains between the semiconductor structure 10 and the support member 102. Accordingly, a plurality of light emitting elements 1 supported on the support member 102 via the resin member 50 that are isolated from one another can be obtained.

After removing the resin member 50, the resist film 92 may remain on the cover member 60 or not. In this embodiment, during the removal of the portion of the resin member 50, the resist film 92 is also removed together with the resin member 50, eliminating the resist film 92. This allows for efficiently manufacturing semiconductor elements as compared to a case in which the resist film 92 is removed in a separate step. The resist film 92 shown in FIG. 13 can be formed by forming a resist film to be continuous on a portion of the cover member 60 located on the first surface 10*a*, a portion of the cover member 60 located on the surface 43*a* of the second insulation film 43, and a portion of the cover member 60 located on the surface 50*a* of the resin member 50, and then removing the portion of the resist film located on the surface 50*a* of the resin member 50 by exposure and developing process. Setting the thickness of the resist film 92 formed in this step to be smaller than that of the resin member 50 in the region not overlapping the cover member 60 allows for eliminating the resist film 92 during the removal of the resin member 50 by etching. The thickness of the resist film 92 formed in this step is, for example, 0.5 μm to 4 μm. The thickness of the resin member 50 located in the region not overlapping the cover member 60 is, for example, larger than 4 μm and 15 μm or smaller. In the present specification, the term "thickness" indicates the maximum thickness. Under the etching conditions for removing the resin member 50, the etch rate for the resin member 50 is practically the same as the etch rate for the resist film 92.

Step of Removing Cover Member

The method of manufacturing a semiconductor element according to this embodiment includes a step of removing the cover member 60 subsequent to the step of removing the first insulation film 40 and the resin member 50 using the cover member 60 as a mask.

Figure 20:
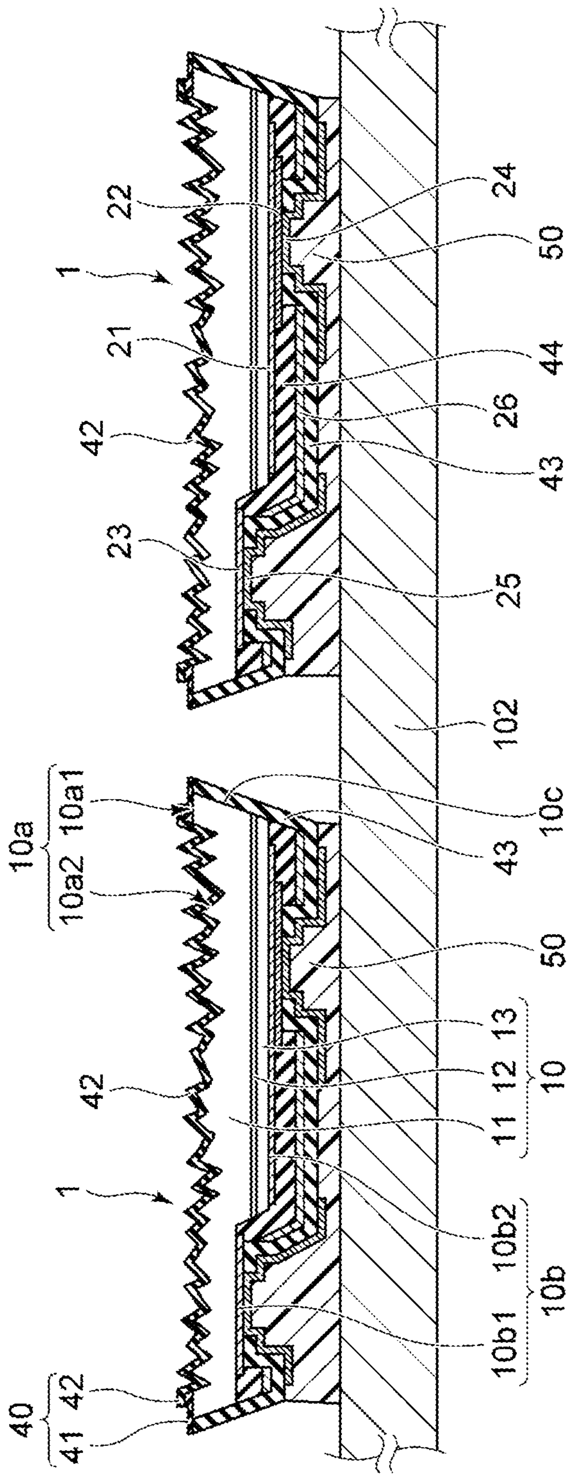
FIG. 20 is a schematic cross-sectional view explaining a step in the method of manufacturing a semiconductor element according to the embodiment of the present invention.

The first insulation film 40 on the first surface 10*a* is exposed when the cover member 60 is removed as shown in FIG. 20. Removing the cover member 60 from the first surface 10*a* which is the main light extraction surface of the light emitting element 1 allows for increasing the efficiency in extracting light from the first surface 10*a*.

Subsequently, for example, by irradiating laser light on the resin member 50 from the support member 102 side, the resin member 50 disposed on the second surface 10*b* side is removed. This can separate the light emitting element 1 from the support member 102. The first surface 10*a* of each light emitting element 1 separated from the support member 102 is adhered to a tacky sheet via the first insulation film 40. The light emitting elements 1 may be separated from the support member 102 after being adhered to the sheet. After separating a light emitting element 1 from the support member 102, the resin member 50 remaining on the second surface 10*b* side is removed by RIE, for example, to expose the first electrode 25 and the second electrode 24. The exposed first electrode 25 and the second electrode 24 function as external connection terminals to be connected to a mounting substrate. The light emitting element 1 is, for example, a light emitting diode.

According to this embodiment, in the step of removing the resin member 50, at least the portion of the first insulation film 40 located on the roughened inner region 10*a*2 (second film 42) is covered by the cover member 60 and is not easily removed. Thus, the thickness of the first insulation film 40 (second film 42) can be made smaller than the thickness of the second insulation film 43 disposed on the third surface 10*c*. This can improve the efficiency in extracting light from the inner region 10*a*2 via the first insulation film 40.

As described above, the resist film 92 shown in FIG. 13 can be formed by forming a resist film to be continuous on the portion of the cover member 60 located on the first surface 10*a*, the portion of the cover member 60 located on the surface 43*a* of the second insulation film 43, and the portion of the cover member 60 located on the surface 50*a* of the resin member 50, and then removing the resist film located on the surface 50*a* of the resin member 50 by exposure and developing process.

Furthermore, in the step of removing the portion of the cover member 60 located on the surface 50*a* of the resin member 50 with the cover member 60 remaining on the first surface 10*a*, the developing solution used in the developing process for removing the resist film the portion can further remove the portion of the cover member 60 located on the surface 50*a* of the resin member 50. For example, by using a metal containing Al as a main component for the cover member 60 and an alkaline solution as the developing solution, the cover member 60 can be removed. At this time, the Al composition ratio of the cover member can be set to 80% or higher. Developing the resist film 92 and removing the portion of the cover member 60 located on the surface 50*a* of the resin member 50 in the same step allows for increasing the efficiency in manufacturing semiconductor elements. For the cover member 60, for example, a film combining Al and Cu can be used.

The cover member 60 can be removed by using the developing solution described above in the step of removing the cover member 60 located on the first surface 10*a* subsequent to removing the resin member 50.

In the case of using a solution such as the developing solution described above in the step of removing the cover member 60 located on the surface 50*a* of the resin member 50 with the cover member 60 remaining on the first surface 10*a*, a portion of the cover member 60 located under the resist film 92 can be removed. This allows the outer edges 60*o* of the cover member 60 to be located inward of the outer edges 10*o* of the first surface 10*a* in a plan view as shown in FIG. 13 and FIG. 14.

Figure 19:
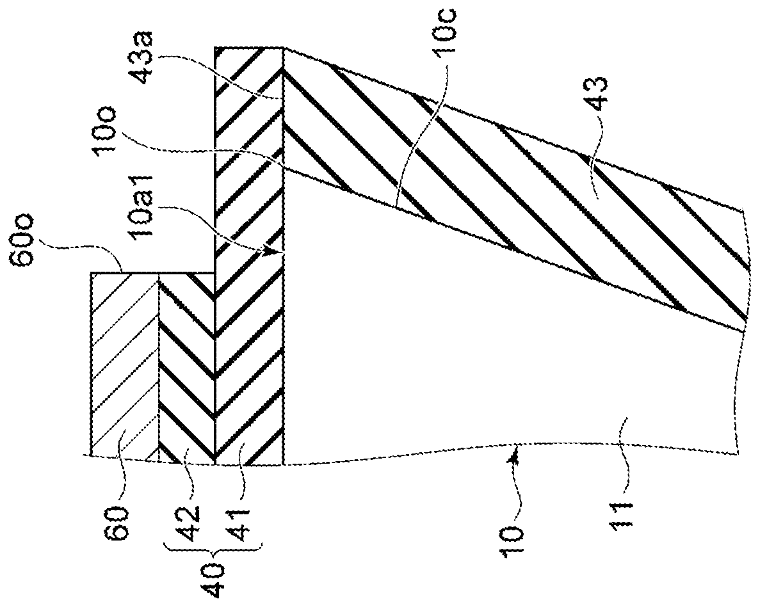
FIG. 19 is an enlarged view of the section A in FIG. 17.

Subsequently, the elimination of the resist film 92 in the step of removing the resin member 50 causes the cover member 60 to be exposed as shown in FIG. 17 and FIG. 18. In the plan view, the outer edges 60*o* of the cover member 60 is located inward of the outer edges 10*o* of the first surface 10*a*, so that a portion of the first insulation layer 40 located outward of the outer edges 60*o* of the cover member 60 and exposed from the cover member 60 can be partly removed together with the resin member 50 in the step of removing the resin member 50. By partly removing the portion of the first insulation film 40 located outward of the outer edges 60*o* of the cover member 60 and exposed from the cover member 60, the thickness of a portion of the first insulation film 40 located inward of the outer edges 10*o* of the first surface 10*a* can be reduced as shown in FIG. 19 which is an enlarged view of the portion A in FIG. 17. This can increase the efficiency in extracting light from the first surface 10*a* in the region near the outer edges 10*o* of the first surface 10*a*.

The thickness of the first insulation film 40 on the peripheral region 10*a*1 in which the first film 41 and the second film 42 are disposed is larger than the thickness of the first insulation film 40 on the inner region 10*a*2 in which the second film 42 is disposed and the first film 41 is not disposed. In the step of removing the portion of the cover member 60 located on the surface 50*a* of the resin member 50 with the cover member 60 remaining on the first surface 10*a*, the outer edges 60*o* of the cover member 60 can be positioned to overlap the peripheral region 10*a*1 of the first surface 10*a* in a plan view. This allows for reducing a thickness of the thicker portion of the first insulation film 40 as shown in FIG. 19 during the removal of the resin member 50, which allows for improving the light extraction efficiency.

Embodiments of the present invention includes the methods of manufacturing light emitting elements described below.

In the foregoing, certain embodiments of the present invention have been explained with reference to a specific example. The present invention, however, is not limited to these specific examples. All forms implementable by a person skilled in the art by suitably making design changes based on any of the embodiments of the present invention described above also fall within the scope of the present invention so long as they encompass the subject matter of the present invention. Furthermore, various modifications and alterations within the spirit of the present invention that could have been made by a person skilled in the art also fall within the scope of the present invention.

What is claimed is:

1. A method of manufacturing a semiconductor element, the method comprising:

providing a structure comprising:

a semiconductor structure having a first surface, a second surface opposite the first surface, and a third surface connecting the first surface and the second surface, a resin member covering the second surface and the third surface, and a first insulation film disposed continuously on the first surface and a surface of the resin member adjacent to the first surface in a plan view;

forming a cover member disposed continuously on a portion of the first insulation film located on the first surface and a portion of the first insulation film located on the surface of the resin member;

forming a resist film on the cover member, and removing a portion of the cover member located on the surface of the resin member such that a remaining portion of the cover member remains on the portion of the first insulation film located on the first surface;

subsequent to the step of forming the resist film and removing the portion of the cover member, removing a portion of the first insulation film and a portion of the resin member that are located in a region not overlapping the remaining portion of the cover member in the plan view by etching using the cover member as a mask; and subsequent to the step of removing the portion of the first insulation film and the portion of the resin member, removing the remaining portion of the cover member; wherein:

an etch rate for the cover member in the step of removing the portion of the first insulation film and the portion of the resin member is lower than an etch rate for the resist film in the step of removing the portion of the first insulation film and the portion of the resin member.

2. The method according to claim 1, wherein, in the step of removing the portion of the first insulation film and the portion of the resin member, the resist film is removed together with the portion of the resin member.

3. The method according to claim 1, wherein:

the cover member is a metal; and in the step of forming the resist film and removing the portion of the cover member, the resist film is formed to be continuous on a portion of the cover member located on the first surface and the portion of the cover member located on the surface of the resin member, and then a portion of the resist film located on the surface of the resin member is removed by exposure and developing process, a developing solution used in the developing process for the removal of the portion of the resist film further removes the portion of the cover member located on the surface of the resin member.

4. The method according to claim 3, wherein, in the step of removing the portion of the first insulation film and the portion of the resin member, the portion of the resist film is removed together with the portion of the resin member.

5. The method according to claim 1, wherein:

in the step of forming the resist film and removing the portion of the cover member, the portion of the cover member is removed such that outer edges of the cover member are located inward of outer edges of the first surface, and in the step of removing the portion of the first insulation film and the portion of the resin member, a portion of the first insulation film located inward of the outer edges of the first surface is further removed.

6. The method according to claim 1, wherein:

the structure comprises a second insulation film disposed on the third surface of the semiconductor structure, a thickness of the second insulation film is greater than a thickness of the first insulation film.

7. The method according claim 1, wherein:

in the step of providing the structure, the first surface of the semiconductor structure of the structure has a peripheral region, and a roughened inner region located inward of the peripheral region in the plan view, and the first insulation film comprises:

a first film that is continuous on the peripheral region and the surface of the resin member, and a second film that is continuous on the first film and the roughened inner region; and in the step of forming the resist film and removing the portion of the cover member, the remaining portion of the cover member remains with outer edges of the cover member overlapping the peripheral region in the plan view.

8. The method according to claim 2, wherein:

in the step of providing the structure, the first surface of the semiconductor structure of the structure has a peripheral region, and a roughened inner region located inward of the peripheral region in the plan view, and the first insulation film comprises:

a first film that is continuous on the peripheral region and the surface of the resin member, and a second film that is continuous on the first film and the roughened inner region; and in the step of forming the resist film and removing the portion of the cover member, the remaining portion of the cover member remains with outer edges of the cover member overlapping the peripheral region in the plan view.

9. The method according to claim 3, wherein:

in the step of providing the structure, the first surface of the semiconductor structure of the structure has a peripheral region, and a roughened inner region located inward of the peripheral region in the plan view, and the first insulation film comprises:

a first film that is continuous on the peripheral region and the surface of the resin member, and a second film that is continuous on the first film and the roughened inner region; and in the step of forming the resist film and removing the portion of the cover member, the remaining portion of the cover member remains with outer edges of the cover member overlapping the peripheral region in the plan view.

10. The method according to claim 4, wherein:

in the step of providing the structure, the first surface of the semiconductor structure of the structure has a peripheral region, and a roughened inner region located inward of the peripheral region in the plan view, and the first insulation film comprises:

a first film that is continuous on the peripheral region and the surface of the resin member, and a second film that is continuous on the first film and the roughened inner region; and in the step of forming the resist film and removing the portion of the cover member, the remaining portion of the cover member remains with outer edges of the cover member overlapping the peripheral region in the plan view.

11. The method according to claim 5, wherein:

in the step of providing the structure, the first surface of the semiconductor structure of the structure has a peripheral region, and a roughened inner region located inward of the peripheral region in the plan view, and the first insulation film comprises:

a first film that is continuous on the peripheral region and the surface of the resin member, and a second film that is continuous on the first film and the roughened inner region; and in the step of forming the resist film and removing the portion of the cover member, the remaining portion of the cover member remains with the outer edges of the cover member overlapping the peripheral region in the plan view.

12. The method according to claim 6, wherein:

in the step of providing a structure, the first surface of the semiconductor structure of the structure has a peripheral region, and a roughened inner region located inward of the peripheral region in the plan view, and the first insulation film comprises:

a first film that is continuous on the peripheral region and the surface of the resin member, and a second film that is continuous on the first film and the roughened inner region; and in the step of forming the resist film and removing the portion of the cover member, the remaining portion of the cover member remains with outer edges of the cover member overlapping the peripheral region in the plan view.

* * * * *